Figure 1:
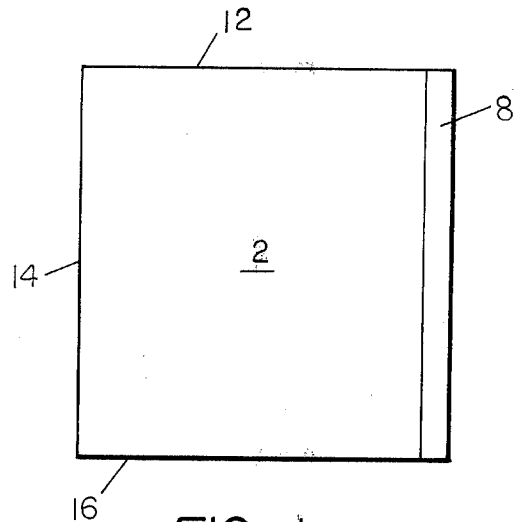

United States Patent [19]

Boling

[11] 4,164,432
[45] Aug. 14, 1979

[54] LUMINESCENT SOLAR COLLECTOR STRUCTURE

[75] Inventor: Norman L. Boling, Toledo, Ohio

[73] Assignee: Owens-Illinois, Inc., Toledo, Ohio

[21] Appl. No.: 932,241

[22] Filed: Aug. 9, 1978

[51] Int. Cl.² ............................................ H01L 31/04
[52] U.S. Cl. ........................... 136/89 PC; 136/89 HY
[58] Field of Search ......... 136/89 PC, 89 HY, 89 FC, 136/89 CL, 89 CA

[56] References Cited

U.S. PATENT DOCUMENTS

| 4,068,121 | 1/1978 | Bringhurst et al. .................. 250/227 |
| 4,110,123 | 8/1978 | Goetzberger et al. ......... 136/89 HY |
| 4,127,425 | 11/1978 | Chambers ........................ 136/89 PC |

*Primary Examiner*—Aaron Weisstuch
*Attorney, Agent, or Firm*—Charles S. Lynch; M. E. Click; D. H. Wilson

[57] ABSTRACT

Disclosed is a luminescent solar collector having a beveled edge meeting an extended face surface thereof at an angle of 40 to 50 degrees, ideally essentially 45 degrees, and physically attached and optically coupled to a relatively small area of said surface a photovoltaic cell adjacent to and parallel to said edge. Usually the beveled edge is a straight edge.

10 Claims, 10 Drawing Figures

LUMINESCENT SOLAR COLLECTOR STRUCTURE

This invention concerns the art of exposing semiconductors to sunlight to convert at least a part thereof to electrical energy. Such means for converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive; in consequence, it has been the practice to gather and concentrate the sunlight reaching a given semiconductor photocell so that extremely large areas of semiconductor material need not be employed as would be necessary without such a gathering system. The common gathering systems in the past were optical systems, wherein lens systems concentrated the light and focused same on a given photocell.

However, such a lens system was and is relatively expensive and is not useful in diffuse light on a cloudy day. More recently, however there has been conceived a different type of collector and concentrator of radiation to be impinged on a semiconductor photocell. For instance, Weber and Lambe in Applied Optics, Vol. 15, pages 2299–2300, October 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way the light from the sun is not only converted to more suitable wavelengths for activation of the photocell, but is concentrated since the light received by the large area of the collector escapes only in the small area where the photocell is optically connected to the collector.

Another article, by Levitt and Weber, appearing in Applied Optics, Vol. 16, No. 10, pages 2684–2689, October 1977, should be read with the article first mentioned.

Other publications aiding in the understanding of the setting of the present invention include Goetzberger, Applied Physics, 14, 123–139, 1977, German patent application No. 2620115 published Nov. 10, 1977 and, referred to therein, German patent application No. 2554226 published June 8, 1977, which is of some peripheral interest.

Also, numerous patents deal with the conversion of solar energy to different wavelengths by means of luminescent or fluorescent layers and impinging emitted light on a photocell; examples are U.S. Pat. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931, benzene and other aromatic hydrocarbons are said to be "fixed" in layers of a silicone resin superimposed on the photocell.

The present invention is concerned with luminescent solar collectors and concentrators of the general type disclosed in the Goetzberger et al. publication, in German application No. 2620115, in the Weber and Lambe paper and in the Levitt and Weber paper. In this last publication, for instance, a square collector 68 mm. on a side and 2.8 mm. thick was given an aluminum mirror coating on three edges and coupled to a Si photovoltaic diode on the fourth edge.

As used herein and in the claims the term "luminescent solar collector" means a light conducting medium having two opposing, usually parallel, faces of extended area relative to the other surfaces of said medium (such as edges), which medium contains a luminescent species that absorbs solar radiation of one wavelength and emits at a longer wavelength. Of course, in accordance with well understood optical principles (Snells law), that portion of the emitted luminescent radiation generated at larger angles than the critical angle relative to a line perpendicular to a given extended surface of the medium is trapped within the medium by the process of total internal reflection. Such portion for a flat sheet having an index of refraction of 1.5 is about 75 percent, as is well-known. As is well-known a luminescent solar collector, because of total internal reflection, collects and concentrates the trapped luminescent radiation and can deliver it to a relatively small area of the collector, such as a small area or areas of the collector face or one or more or all of the edges of the luminescent radiation collection medium, where it can be optically coupled to a desired means, such as to a photovoltaic cell. By "optically coupled" as used herein is meant that there is a low or minimum reflection at the interface of the photocell and the collection medium or trapping sheet.

The shape of the faces can be rectangular, triangular, hexagonal or any other shape, regular or irregular.

It is emphasized that the foregoing definition of a "luminescent solar collector" is broad, that the "light conducting medium" of said definition can be one layer or two or more layers of a light conducting material or materials such as a plastic or a glass, each layer being optically coupled to the next, to make the collector or trapping medium. One or more, or all, of the layers can contain a luminescent species as defined. When a luminescent species is present in more than one such layer the absorption band of one can advantageously overlap the emission band of the other species, thus coupling or cascading the emission of one luminescent species to the absorption of another. Or two or more such "coupled" luminescent species can be present in a given layer of the collection medium so that, again, the emission spectrum of one overlaps the absorption spectrum of the other in a cascade arrangement, as in Swartz et al. in Optics Letters, Vol. 1, No. 2, August 1977, pp. 73–75, and in Science News, Vol. 112, No. 20, Nov. 12, 1977, pp 313–314, or as on page 130 of the cited Goetzberger et al. publication.

The concept and structure of a luminescent solar collector having a light conducting medium of two or more layers is described in a paper entitled "Luminescent Solar Concentrator" by C. F. Rapp and N. L. Boling presented before the XIII IEEE Photovoltaic Specialists Conference, June 5–8, in Washington, D.C. at the Americana Hotel, and copies of this paper are currently available from the authors if addressed to them at P.O. Box 1035, Toledo, Ohio 43666. See also Optical Spectra, April 1978, under heading "Industry Briefs."

In the main embodiment of the apparatus of the present invention, the edge surfaces of the luminescent solar collector have a highly reflective coating or mirror to prevent escape of trapped luminescent radiation at such edges unless coupled to a photovoltaic cell, as will be understood. However, one or more edges can be used for other purposes such as (1) a display of concentrated light or to activate liquid crystal displays as in the extended surface displays of German OLS No. 2554226 dated June 8, 1977 or (2) coupled to other utilization such as means for absorbing luminescent rays and converting same to heat. Normally, however, a structure according to the invention will have a reflective coating on all edge surfaces.

In the prior art cited herein, most of the luminescent solar collectors used to activate solar cells have a photovoltaic solar cell optically coupled to an edge surface thereof. However, in German patent application No. 2620115 published Nov. 10, 1977, the inventors recognized that there is a problem in efficiently coupling a photocell to the extended face of a luminescent solar collector, as opposed to an edge surface.

Figure 10:
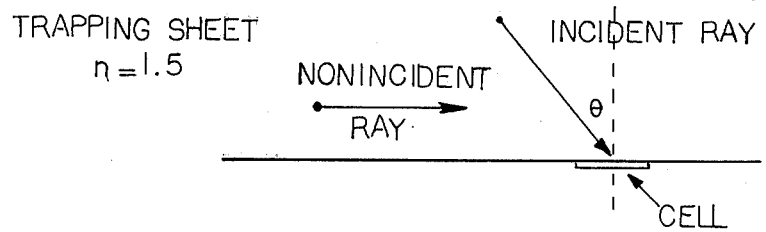

The basic problem arises from the shallow angles at which many of the rays strike the luminescent solar collector-photocell interface, as exemplified in the sketch of FIG. 10. In this illustration, with a trapping sheet refractive index of 1.5, all trapped luminescent rays (emanating internally in the trapping sheet) that strikes the cell do so at an angle $\theta \leq 41.8°$, the critical angle for n=1.5. Some rays do not strike the cell at all in the first pass, perhaps in several passes, as indicated in the drawing by the "nonincident" ray. The number of these nonincident rays is a function of the ratio of the cell width to the trapping sheet thickness. Obviously, a cell on a thin sheet will intercept more of the light passing the cell.

Consider the distribution of the ray direction in the sheet. The fraction F of the trapped rays moving in a direction between $\theta = 90°$ and $\theta$ is given by $F = \cos \theta / \cos \theta_C$, where $\theta_C$ is the critical angle. Thus for n=1.5, 67% of the trapped energy that is incident on the cell at all strikes it at angles between $\theta = 60°$ and $\theta = 90°$.

AR (antireflection) coatings for efficiently coupling the light from the trapping sheet into the cell can be designed so that little reflection occurs for angles less than approximately 60°. However, for progressively greater angles, AR coatings become less effective, until at near 90° no AR effect at all is achieved. Therefore, one solution is to design the luminescent solar collector in such a way that most trapped rays are incident on the cell-collector interface at $\theta \leq 60°$ angles.

Figure 2:
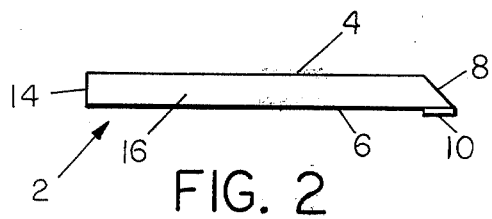
Figure 4:
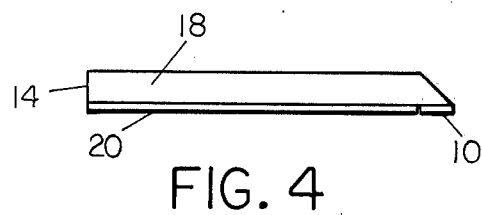

The proposed solution to this problem in the German patent application is illustrated in FIG. 2 therein (and as well as in FIG. 4). In FIG. 2, notches which are mirrored are cut in the collector plate opposite the location of the photocell. Although the photocell in FIG. 2 is not actually shown as being coupled or bonded to the collector plate, if the cell were optically coupled to the collector plate, the mirrored notches would work by converting a number of the shallow angled rays to steep angle rays so that they would hit the solar cell instead of passing over it. However, there are several disadvantages to this scheme. Unless the notches are very deep or the trapping sheet very thin relative to the notched area, a large fraction of the light can escape past the cell area and past the notch area. Thus, it is obvious from the German patent application drawing that, given the relative dimensions indicated in the drawing, only a small fraction of the originally shallow angle luminescence will ever strike the cell. Making the notches deep of course weakens the structure, and making the cell wide decreases the concentration ratio of the area of the collector-concentrator to the area of the expensive photocell material.

A further disadvantage of the structure of the German patent application lies in the fabrication and silvering of the notches. If the notches are not sharp at the troughs, a loss of efficiency in converting the ray angle results. Also, given even the best silvering or mirroring a five to ten percent reflection loss occurs at the notches.

It is an object of the present invention to provide a luminescent solar collector more efficiently coupled to a photovoltaic cell.

It is another object to provide a luminescent solar collector with a photovoltaic cell coupled to a small portion of an extended face area thereof, wherein most luminescent rays created in said collector will eventually strike the coupled area at a steep angle in order to minimize reflection losses and insure relatively efficient coupling.

Other objects, as well as aspects and advantages, of the invention will become apparent from a study of this specification.

According to the present invention, there is provided a luminescent solar collector having a beveled edge meeting an extended face surface thereof at an angle of 40 to 50 degrees, ideally essentially 45 degrees, and physically attached and optically coupled to a relatively small area of said surface a photovoltaic cell adjacent to and parallel to said edge, said beveled edge having a highly reflective coating thereon. Usually the beveled edge is a straight edge.

This arrangement, better understood in connection with the drawings herein, assures that essentially all luminescent rays strike the photocell at angles $\theta$ of 45° or less on the first pass, i.e., without returning to or toward the opposite side of the collector, a far more efficient arrangement than that disclosed in the German application.

In a particular embodiment of the invention, a flat luminescent solar collector whose extended face surfaces are bounded by straight lines has all edge surfaces beveled and mirrored in the manner before described with photovoltaic cells associated with each such edge as described in the proceeding paragraph, and also has, optically coupled to one of the faces of extended area of the luminescent solar collector, a repeating pattern of photovoltaic cells, the unit of said repeating pattern preferably being a regular hexagon or a rectangle, which latter is usually in the shape of a square.

Figure 3:
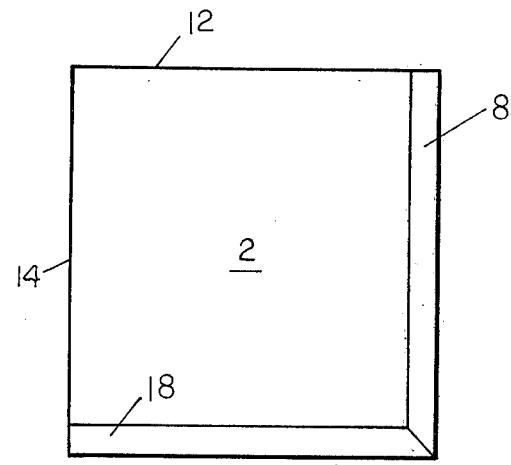
Figure 5:
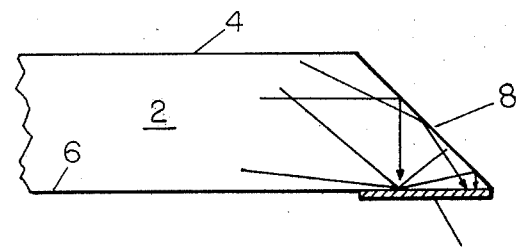
Figure 6:
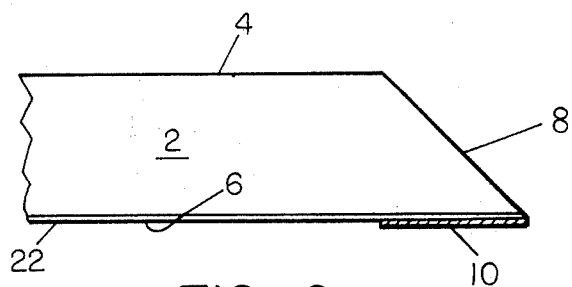
Figure 7:
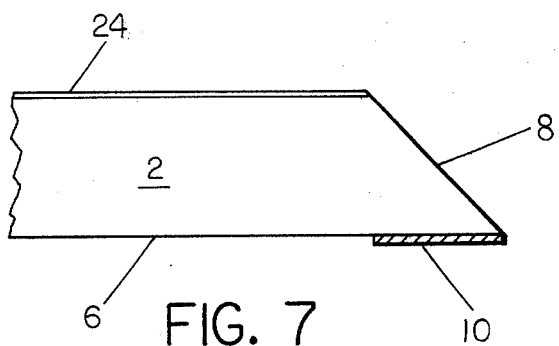
Figure 8:
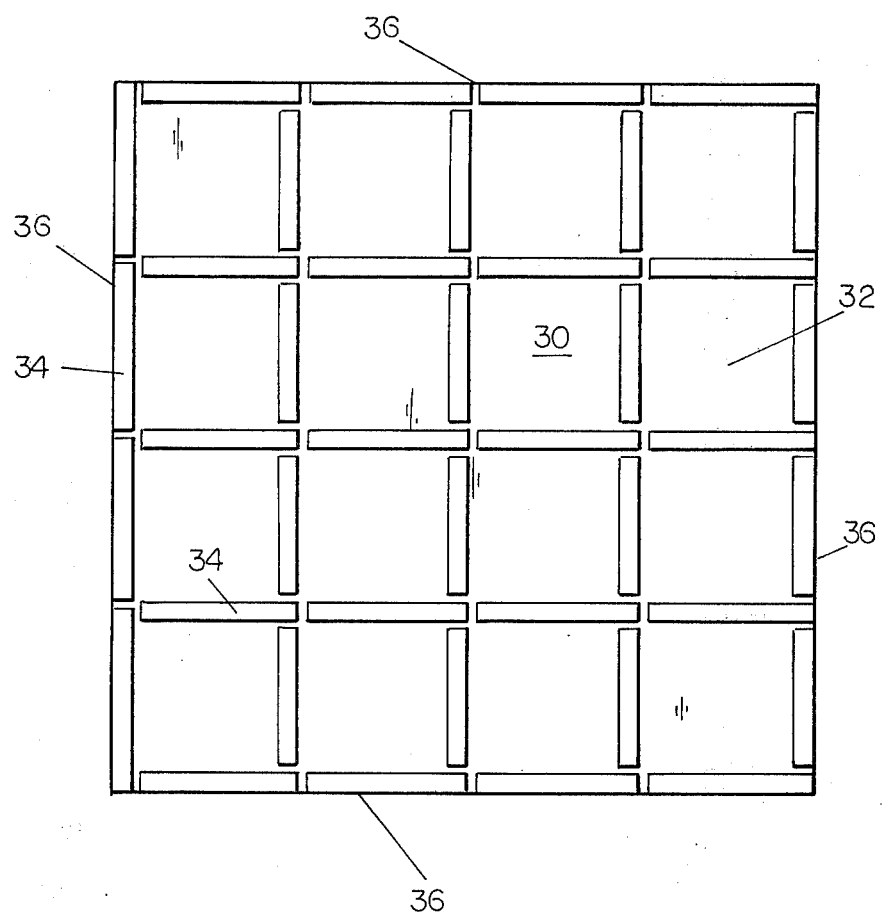
Figure 9:
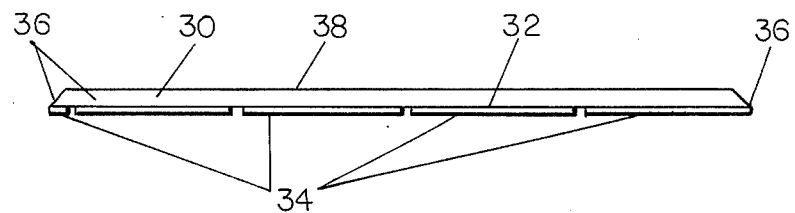

The invention and some of its embodiments, advantages and features is better understood in connection with a description of the accompanying drawings of which FIG. 1 is a top view of a luminescent solar collector of the invention and FIG. 2 is a front view thereof, while FIG. 3 is a top view of another embodiment of the structure of the invention and FIG. 4 is a front view thereof, FIG. 5 is a greatly enlarged view of part of FIG. 2 that shows the structure of the invention and that depicts the path of several different luminescent rays and FIG. 6 is the same as FIG. 5 except that it is shown as having a thin luminescent layer along the bottom, while FIG. 7 is the same as FIG. 5 except that it is shown as having a thin luminescent layer along the top surface, FIG. 8 is a bottom view of another embodiment of the luminescent solar collector of the present invention and FIG. 9 is a front view thereof and, finally, FIG. 10 is a sketch previously used in explaining the principles and some of the advantages of the present invention.

In FIGS. 1 and 2 luminescent solar collector 2 has a top surface 4 and a bottom surface 6, as well as beveled edge 8 which carries a highly reflective coating such as a silver mirror coating. Adjacent to beveled edge 8 all along the bottom at the edge beneath beveled edge 8 is photocell 10. The other edges 12, 14 and 16 usually also have highly reflective coating but they can, of course, also instead contain optically coupled photocells or they can be coupled to other utilization means as discussed hereinbefore.

In FIGS. 3 and 4 like parts are numbered the same as in FIGS. 1 and 2. FIG. 1 can, instead of having only one beveled edge with a photocell beneath it, have 2, 3 or 4 beveled edges, each having a photocell beneath it as photocell 10 is beneath beveled edge 8. FIGS. 3 and 4 illustrate one such embodiment wherein the second beveled edge is 18 and the second photocell is 20.

FIG. 5 illustrates the principles of the invention. It is obvious that nearly every luminescent ray is this scheme eventually strikes the cell at an angle $\theta$ of 45° or less, and that the larger angle $\theta$ rays actually strike the interface more than once. Although only one plane is shown, it is also obvious that only the ray components in this plane need be considered for present purposes. Thus, coupling in this scheme is very efficient, approaching 100 percent, the major loss being the loss upon reflection from the mirror. Also, the cell can be easily coupled to very thin films, the only requirement on the film thickness being that it be great enough to figure to the desired angle.

It is emphasized that the luminescent solar collector as used in this specification, including the description of FIGS. 1, 3, 5 and 8, can be not only a single layer such as depicted in FIGS. 1, 3 and 5, which single layer contains a luminescent species throughout, and is a layer thick enough that the angle at the edge can be figured as before noted, but it can also be made up of multiple layers, so that the thick layer can have deposited on it in physical and optical contact one or more layers of light conducting material, each containing at least one luminescent species. For instance, as shown in FIG. 6, there can be a bottom layer 22 such as poly(methyl methacrylate) plastic containing a luminescent dye or as shown in FIG. 7 a top layer 24 of the same description. In either case the thick supporting layer can be devoid of a luminescent species or it can contain one or more luminescent species, as has been indicated in the general description herein of a luminescent solar collector, and for the purpose indicated. Moreover, these layers such as 22, 24 are usually thin, say on the order of 1 to 2 mils thick, although they can be thicker. Furthermore, one luminescent solar collector can contain both layers 22 and 24 on the single supporting thick layer. Furthermore, layer 24 in any of the instances mentioned can contain a species which absorbs at least part of the ultraviolet rays, which species can be luminescent or not, one of the main purposes for such a layer being to protect underlying luminescent species that can be deteriorated by ultraviolet light.

Moreover, in FIG. 6 the thick supporting layer can be a light conducting material that contains an ultraviolet light absorber, luminescent or not, for the same purposes enumerated above for layer 24 of FIG. 7.

Furthermore, as will be understood from the previous general description, either layer 22 or layer 24, or both, can in fact be multiple layers containing different luminescent species or each of them can be a single layer containing multiple luminescent species, for the purposes set forth in the general description of a luminescent solar collector hereinbefore.

The operation of the various embodiments of FIGS. 1 to 7 is apparent. Sunlight strikes the face of extended area of the luminescent solar collector and one or more luminescent species, wherever located, absorbs portions of the sunlight and converts these to longer wavelengths. When multiple luminescent species are present in any of the arrangements before described, energy from the output of some of the luminescent species may then also be transferred to another luminescent species to give off a still longer wavelength. In any event, a high proportion of the luminescent radiation so produced (the proportion depending on the critical angle corresponding to the index of refraction of the particular medium) bounces back and forth until it reaches either a mirrored edge or is coupled out in a photocell. Rays that strike mirrored edges that are not beveled eventually find their way back for the most part to the beveled mirrored edge and then are reflected at steep angles $\theta$, as before described, onto the photocell 10 or 18. Some rays, of course, do not ever strike a non-beveled mirrored edge but first strike either the photocell or the beveled mirrored edge, as will be understood.

In order to increase the practical size or area of a the extended face surface of a given luminescent solar collector of the invention having the beveled edge with photocells contiguous thereto on the face as shown in FIG. 5, for instance, the structure of FIGS. 8 and 9 is contemplated as a particularly advantageous embodiment. In this structure all four edges of the luminescent solar collector are beveled as before described, and underlying the beveled edges and contiguous thereto are optically coupled photocells.

In FIGS. 8 and 9, luminescent radiation collection medium 30 containing one or more luminescent species has attached to the bottom face of extended area 32 thereof a plurality of semiconductor photovoltaic cells 34 arranged in a repeating pattern of squares. Each cell 34 can actually be a plurality of cells end to end. This, of course, is also true with respect to the photocells of FIGS. 1–7. Further, as will be understood by those skilled in the art, each cell is physically bonded to and optically coupled with the bottom face 32 of collector 30. As in the other embodiments, the bonding material advantageously has a refractive index close to that of collection medium 30 and in fact can be the same material as collection medium 30. For instance, if collection medium 30 is poly(methyl methacrylate), a common form having the trade name Plexiglas, a cement can be made by dissolving some of the poly(methyl methacrylate) in a suitable solvent and used as the bond between the luminescent solar collector sheet 30 and the cell 34. Moreover, it is usually advantageous, as will be understood, that cell 34 carry an anti-reflection coating (such as an interference coating) on the side bonded to the trapping sheet 30.

As indicated in FIG. 9, all four edges 36 of the luminescent solar collector are beveled as described with respect to the general statement of the invention, that is, at an angle of 40 to 50 degrees, ideally 45°, and contain a highly reflective coating. Of course, as in the other embodiments of the invention a photocell underlies the beveled edge and is contiguous therewith. In FIGS. 8 and 9 the photocells are shown with appreciable spaces therebetween for illustrative purposes, but in actual practice they abut each other as closely as practicable without physically touching so that radiation can be coupled out as intended.

Sunlight strikes face 38 of extended area 32 of the collector 30 containing one or more luminescent species which absorb portions of the sunlight and convert these to longer wave lengths. A large portion of the luminescent radiation is trapped in the collection medium 30, also known as the trapping sheet, and a major portion of the luminescent radiation propagated is totally and internally reflected toward one of the cells.

As will be understood, that radiation missing the photocells located within the periphery and hitting the mirrors is reflected almost entirely back onto the peripheral photocells at desirable, steep angles $\theta$, effectively collecting almost all of the trapped luminescent radiation not coupled out in the photocells located away from the periphery of the collector. As will be understood, the photocell in reaction to the luminescent radiation creates electricity which is delivered by electrical leads, not shown.

Other examples of trapping sheets, which contain at least one luminescent species are polystyrene resin, polycarbonate resin, ethylcellulose, and nitrocellulose. Cements of these bonding can be made by dissolving polystyrene in benzene, polycarbonate in ethylene dichloride and the two cellulose derivatives in acetone. It is emphasized that normally the face area of the trapping sheet is much larger compared to the area of the photovoltaic cells than is depicted in the drawings herein. Thus, depending in part on the luminescent light absorption capacity inherent in the luminescent radiation collection medium, the ratio of the area thereof to the total area of photocells might be as high as 50 or 100 to 1, or even higher. However, the drawings herein are true in depicting that the edge photocells completely underlie the projected width of the beveled edges.

As luminescent materials useful in the present invention there can be mentioned by way of example fluorescent chelates, fluorescent dyes and, especially when used in a glass layer of the collection medium, inorganic ions such as $Nd^{III}$ or $Eu^{III}$.

In using the solar collector-photocell assemblies of the invention, either extended face of the collection medium can be turned toward the sun, although usually it will be preferred to have the photocells facing away from the sun simply so that they will not shade part of the luminescent collection medium.

In a specific example of the invention, a luminescent solar collector according to FIGS. 8 and 9 (have all edges beveled at a 45° angle) comprises a poly(methyl methacrylate) plate 180 cm. on a side (the bottom side) and 2 mm. thick, containing 1.17 mgs. of fluorescent dye rhodamine 6 G perchlorate per 50 grams of polymer dispersed throughout, and the plate is covered from edge to edge each direction by a grid of 12 equal squares of photovoltaic silicon semiconductor cells having P-N junctions. The cells have electrical connections (not shown) on opposite sides across the P-N junctions. The cells are optically coupled and attached by a solution of 20 weight percent poly(methyl methacrylate) in ethylene dichloride applied as the adhesive and serving as the optical coupling index film. The solvent is of course allowed to dry, or evaporate.

The plate is made by dissolving Plexiglas poly(methyl methacrylate) and the requisite amount of the dye in ethylene dichloride to obtain a 35 weight percent solution of the acrylate. The mixture is cast in the shape of the plate of the foregoing dimensions, but thicker, and the solvent is allowed to evaporate slowly to form the plate, after which the solar cells are attached as noted.

As will be evident to those skilled in the art, various modifications of this invention can be made or followed in the light of the foregoing disclosure and discussion without departing from the spirit and scope of the disclosure or from the scope of the claims.

I claim:

1. A luminescent solar collector having a beveled edge meeting an extended face surface thereof at an angle of 40 to 50 degrees, and physically attached and optically coupled to a relatively small area of said surface at least one photovoltaic cell adjacent to and parallel to said edge, said beveled edge having a highly reflective coating thereon.

2. A luminescent solar collector according to claim 1 wherein more than one edge is beveled at said angle and is so coated, and for each such beveled edge, physically attached and optically coupled to a relatively small area of said surface, at least one photovoltaic cell adjacent to and parallel to said edge.

3. A luminescent solar collector according to claim 2 wherein said angle is essentially 45 degrees.

4. A luminescent solar collector according to claim 1 wherein each edge of said collector is beveled at said angle and is so coated, and for each such beveled edge, physically attached and optically coupled to a relatively small area of said surface, at least one photovoltaic cell adjacent to and parallel to said edge.

5. A luminescent solar collector according to claim 4 wherein said angle is essentially 45 degrees.

6. A luminescent solar collector according to claim 4 wherein opposed face surfaces of extended area are bounded by straight lines and there is a repeating pattern of photovoltaic cells optically coupled to one of the face surfaces of extended area, the unit of said repeating pattern being a regular hexagon or a rectangle.

7. A luminescent solar collector of claim 6 wherein the unit of said repeating pattern is a square.

8. A luminescent solar collector according to claim 7 wherein said angle is essentially 45 degrees.

9. A luminescent solar collector according to claim 6 wherein said angle is essentially 45 degrees.

10. A luminescent solar collector according to claim 1 wherein said angle is essentially 45 degrees.

* * * * *